United States Patent
Nagoya

(10) Patent No.: US 7,659,216 B2
(45) Date of Patent: Feb. 9, 2010

(54) METHOD FOR PRODUCING ANNEALED WAFER AND ANNEALED WAFER

(75) Inventor: Takatoshi Nagoya, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 301 days.

(21) Appl. No.: 11/665,013

(22) PCT Filed: Oct. 12, 2005

(86) PCT No.: PCT/JP2005/018746

§ 371 (c)(1),
(2), (4) Date: Apr. 10, 2007

(87) PCT Pub. No.: WO2006/041069

PCT Pub. Date: Apr. 20, 2006

(65) Prior Publication Data

US 2009/0011613 A1    Jan. 8, 2009

(30) Foreign Application Priority Data

Oct. 13, 2004   (JP) ............................. 2004-299228

(51) Int. Cl.
    *H01L 21/00*   (2006.01)
(52) U.S. Cl. ................. 438/795; 257/E21.328
(58) Field of Classification Search ............ 438/795
    See application file for complete search history.

(56) References Cited

U.S. PATENT DOCUMENTS

| | | | |
|---|---|---|---|
| 6,287,984 B1 * | 9/2001 | Horie | 438/758 |
| 2002/0187658 A1 * | 12/2002 | Kobayashi et al. | 438/795 |
| 2004/0119117 A1 * | 6/2004 | Kushida | 257/342 |

FOREIGN PATENT DOCUMENTS

JP          A 51-134071          11/1976

(Continued)

OTHER PUBLICATIONS

Realize Co., Ltd., "Chemical Contamination in an Semiconductor Process Envirnoment and Measures for it (1997), p. 60."

(Continued)

*Primary Examiner*—W. David Coleman
*Assistant Examiner*—Christine Enad
(74) *Attorney, Agent, or Firm*—Oliff & Berridge, PLC

(57) ABSTRACT

The present invention is a method for producing an annealed wafer, wherein, at least, when a boat in which a semiconductor wafer is placed is inserted into a furnace tube, the boat is inserted along with introducing an inert gas into the furnace, so that entirety of the semiconductor wafer to be a product reaches a thermally uniform portion, then an insertion rate of the boat in which the semiconductor wafer is placed is decelerated and/or suspended, so that an interval between the furnace tube and the shutter is maintained for a predetermined time, and then the furnace tube is blocked in with the shutter. Thereby, there can be provided a method for producing an annealed wafer by which during the heat treatment, it can be more certainly prevented that the wafer is contaminated with conductive impurities and that thereby resistivity of the wafer is changed before and after the heat treatment.

12 Claims, 2 Drawing Sheets

FOREIGN PATENT DOCUMENTS

| | | |
|---|---|---|
| JP | A 60-247935 | 12/1985 |
| JP | A 5-74762 | 3/1993 |
| JP | A 2002-100634 | 4/2002 |
| JP | A 2004-207601 | 7/2004 |
| JP | 2004-228459 A | 8/2004 |

OTHER PUBLICATIONS

Uwe, "Horizontalofen Diffusion Cesar-Geratebefehlsatz, Version 1.0", *Centrotherm Elektrischen Anlagen GMBH*, Nov. 14, 2002, pp. 1-36.

* cited by examiner

METHOD FOR PRODUCING ANNEALED WAFER AND ANNEALED WAFER

TECHNICAL FIELD

The present invention relates to a method for producing an annealed wafer in which Grown-in defects and so forth that are COP (Crystal Originated Particle) in a surface of a semiconductor wafer and a source of the COP and so forth, which exist from surface to a depth of some micrometers in a surface layer of the semiconductor wafer, are effectively made to disappear, and more particularly, relates to a method comprising, performing a high-temperature heat treatment under an atmosphere of an inert gas such as argon or a reducing gas such as hydrogen so that COP defects and so forth in the vicinity of the surface are made to disappear, preventing contamination with conductive impurities, and thereby producing an annealed wafer of high quality.

BACKGROUND ART

A semiconductor wafer used in the present-day production of a semiconductor device is made of silicon produced by, for example, Czochralski method (CZ method). In the device process, the temperature has become lower and the integration has become higher, it has been revealed that low-density Grown-in defects have an effect on a characteristic of the device.

Such a Grown-in defect has a shape of an independent or multiply connected structure based on an octahedral void when the defect exists inside crystal, and becomes a concave-shaped pit of a quadrangular pyramid when the defect is exposed to surface after the crystal is processed in a wafer state. And, after the crystal is sliced into a wafer, COP that is a defect pit appearing by performing mirror-polishing and wafer-cleaning has had an effect on oxide dielectric breakdown voltage.

Conventionally, according to slow cooling in the growth by CZ method, the Grown-in defect that is an octahedral void has been planned to be reduced. However, on the other hand, its size has comes to increase. As the device pattern has become even finer, it has become impossible to ignore a size of the Grown-in defect with comparing the Grown-in defect size to a size of the pattern. And, a wafer that has almost none of the Grown-in defects in a device region has been required.

Accordingly, in a frontier process of 64MDRAM, an epitaxial wafer having no Grown-in defects or a hydrogen-argon annealed wafer having a disappearance effect of the Grown-in defects in the vicinity of a surface has been mass-produced and used (see, for example, Japanese Patent Application (Kokai) No. 51-134071 and No. 60-247935).

However, in the case of producing the annealed wafer, it is known that if a silicon wafer is heat-treated under an atmosphere of an argon gas at a high temperature, resistivity of the silicon wafer is changed (for example, Realize Co., Ltd., "Chemical Contamination in an Semiconductor Process Environment and Measures for it (1997), page 60"). It has been estimated that this is because phosphorous or boron from the environment, the heat treatment furnace, and so forth, adheres to the silicon wafer and, diffuses into the inside of the wafer by performing the high-temperature heat treatment in the state, and consequently the resistivity is changed.

As the measures for this, for example, in Japanese Patent Application (Kokai) No. 2002-100634, it is proposed that in order to prevent boron contamination from the environment, a hydrogen gas is contained in the atmosphere in a temperature region of 950-1100° C. in the heat treatment. This is for removing the boron by utilizing out-diffusion of boron by a high-temperature heat treatment in a hydrogen gas atmosphere, so that the resistivity in a surface layer of the wafer is prevented from changing.

Moreover, in Japanese Patent Application (Kokai) No. 2004-207601, there has been presented a method that the silicon wafer is preliminarily heated at a low temperature before the high-temperature heat treatment, and therefore the phosphorous adhering to the silicon wafer from the environment and the heat treatment furnace and so forth are removed, and thereby resistivity in the vicinity of the surface layer of the wafer is prevented from changing due to phosphorous contamination.

However, even when these methods are used for producing an annealed wafer, the wafer has been contaminated with conductive impurities such as phosphorous in the heat treatment, and resistivity of the wafer cannot be certainly prevented from changing before and after the heat treatment.

DISCLOSURE OF THE INVENTION

The present invention has been made to solve such problems. An object of the present invention is to provide a method for producing an annealed wafer by which during the heat treatment, it can be more certainly prevented that the wafer is contaminated with conductive impurities and that thereby resistivity of the wafer is changed before and after the heat treatment.

In order to solve the above problems, the present invention provides a method for producing an annealed wafer, comprising at least steps of:

placing a semiconductor wafer in a boat supported by a support member;

inserting the boat in which the semiconductor wafer is placed, into a furnace tube;

disposing the semiconductor wafer to be a product, in a thermally uniform portion inside the furnace tube having a temperature distribution that is uniform in a longitudinal direction by heating with a heater;

blocking in the furnace tube with a shutter; and heat-treating the semiconductor wafer;

wherein when the boat in which the semiconductor wafer is placed is inserted into the furnace tube, the boat is inserted along with introducing an inert gas into the furnace, so that entirety of the semiconductor wafer to be a product reaches the thermally uniform portion; then an insertion rate of the boat in which the semiconductor wafer is placed is decelerated and/or suspended, so that an interval between the furnace tube and the shutter is maintained for a predetermined time; and then the furnace tube is blocked in with the shutter.

Some conductive impurities adhering to a surface of the wafer, a boat, a support member for the boat evaporate and are discharged out of the furnace when the boat in which a semiconductor wafer is placed is inserted into a furnace tube. However, conductive impurities that do not evaporate in the insertion of the boat diffuse to the peripheral part of the wafer or do such a thing in the heat treatment, and thereby, resistivity of the semiconductor wafer to be a product is changed. Accordingly, in the present invention, when the boat in which the semiconductor wafer is placed is inserted into the furnace tube, entirety of the semiconductor wafer to be a product is made to reach the thermally uniform portion, then an insertion rate of the boat in which the semiconductor wafer is placed is decelerated and/or suspended, so that an interval between the furnace tube and the shutter is maintained for a predetermined time. Thereby, the slight interval is made to remain before the furnace tube is entirely blocked in with a shutter, so that the conductive impurities adhering to the surface of the wafer, the boat, the support member for the boat, and so forth, are sufficiently evaporated, and the conductive impurities are discharged out of the furnace from the interval between the furnace tube and the shutter. In this way, in the present invention, because conductive impurities adhering to the support member and so forth are sufficiently removed and discharged out of the furnace before the heat treatment, the wafer is in little danger of being contaminated with the conductive impurities during the heat treatment. Therefore, the resistivity of the wafer can be more certainly prevented from changing before and after the heat treatment and the annealed wafer of desired quality can be obtained.

Moreover, for removing the conductive impurities adhering to the wafer, it is not required to add a preliminary heating step before the heat treatment or to prepare a heating furnace for the preliminary heating. Moreover, adjacently installed equipment such as the heating furnace for the preliminary heating is not exposed to a high temperature. Accordingly, compared to a conventional method, the productivity becomes improved and an annealed wafer of high quality can be produced at a lower cost.

Moreover, in the method for producing an annealed wafer according to the present invention, it is possible that the furnace tube is a vertical type.

In a vertical-type furnace, in particular, there has been a problem that the conductive impurities adhering to a support member for the boat contaminate the semiconductor wafer placed in the vicinity of a bottom of the boat. That is, from the reasons that the support member has a large contaminated area and its temperature does not rise and an evaporating gas is difficult to get away therefrom, a large proportion of the conductive impurities is not removed and remains adhering, and therewith the boat has been inserted into the furnace. However, according to a method for producing an annealed wafer of the present invention, because before the heat treatment, and before blocking in the furnace tube with shutter, the conductive impurities adhering to the support member are sufficiently evaporated and discharged out of the furnace, the semiconductor wafer placed in the vicinity of the bottom of the boat can be more certainly prevented from being contaminated with the conductive impurities during the heat treatment.

Moreover, in the method for producing an annealed wafer according to the present invention, it is preferable that a temperature of the thermally uniform portion when the semiconductor wafer to be a product is inserted is 500° C. to 900° C.

When a temperature of the thermally uniform portion when the semiconductor wafer to be a product is inserted is 500° C. to 900° C. as described above, the conductive impurities adhering to the surface of the wafer, the boat, the support member for the boat, and so forth, can be more certainly evaporated. Thereby, the conductive impurities are sufficiently removed and it can be prevented that the conductive impurities transfer from the boat or the support member therefor to the semiconductor wafer, and diffuse from a surface of the semiconductor wafer to the inside thereof. Accordingly, a semiconductor wafer of high quality having little contamination with conductive impurities can be more certainly obtained.

Moreover, in the method for producing an annealed wafer according to the present invention, it is preferable that the heat treatment of the semiconductor wafer is performed at a temperature of 800° C. to 1350° C. under an atmosphere containing any one or more of argon gas, nitrogen gas, helium gas, and hydrogen gas.

When the conductive impurities are removed before the heat treatment and then the semiconductor wafer is heat-treated under the above-described condition, the resistivity hardly changes before and after the heat treatment, and in addition, the annealed wafer of high quality having few Grown-in defects in the vicinity of the surface layer can be obtained.

Moreover, in the method for producing an annealed wafer according to the present invention, it is possible that the semiconductor wafer to be heat-treated is a silicon wafer having a diameter of 200 mm or more.

In recent years, a wafer utilized generally for integrated circuits is a large-diameter silicon wafer having a diameter of 200 mm or more. Therefore, a method by which an annealed wafer of high quality can be more simply and certainly produced is strongly required. The present invention is the method suitable for producing an annealed wafer by heat-treating such a silicon wafer having a diameter of 200 mm or more.

Moreover, in the method for producing an annealed wafer according to the present invention, it is preferable that the semiconductor wafer to be heat-treated contains nitrogen with a concentration of $1 \times 10^{13} \sim 1 \times 10^{15}$ atoms/cm$^3$.

In such a semiconductor wafer having a nitrogen concentration of $1 \times 10^{13} \sim 1 \times 10^{15}$ atoms/cm$^3$, Grown-in defects are scaled-down, the Grown-in defects in the vicinity of the surface layer are easy to be made to disappear by a heat treatment. Accordingly, by heat-treating the wafer, an annealed wafer of high quality having no Grown-in defects in the vicinity of the surface layer can be more certainly obtained.

It is possible that in an annealed wafer produced by such a method for producing an annealed wafer according to the present invention, a concentration of phosphorous in a portion from surface to a depth of 3 μm is $5 \times 10^{14}$ atoms/cm$^3$ or less. Therefore, in the annealed wafer according to the present invention, there is little change of resistivity of the wafer before and after the heat treatment, and the wafer is of extremely high quality.

As described above, according to the present invention, when a boat in which a semiconductor wafer is placed is inserted into a furnace tube, entirety of the semiconductor wafer to be a product is made to reach a thermally uniform portion, then an insertion rate of the boat in which the semiconductor wafer is placed is decelerated and/or suspended, so that an interval between the furnace tube and the shutter is maintained for a predetermined time, and therefore, before the heat treatment the conductive impurities adhering to, a surface of the wafer, the boat, a support member for the boat, and so forth can be sufficiently removed. And, after the conductive impurities are removed, the furnace tube is blocked in with a shutter, and the semiconductor wafer is heat-treated. Therefore, during the heat treatment, the wafer is in little danger of being contaminated with conductive impurities, and resistivity of the wafer can be more certainly prevented from changing before and after the heat treatment. Thereby, an annealed wafer of high quality can be produced.

BEST MODE FOR CARRYING OUT THE INVENTION

Figure 1:
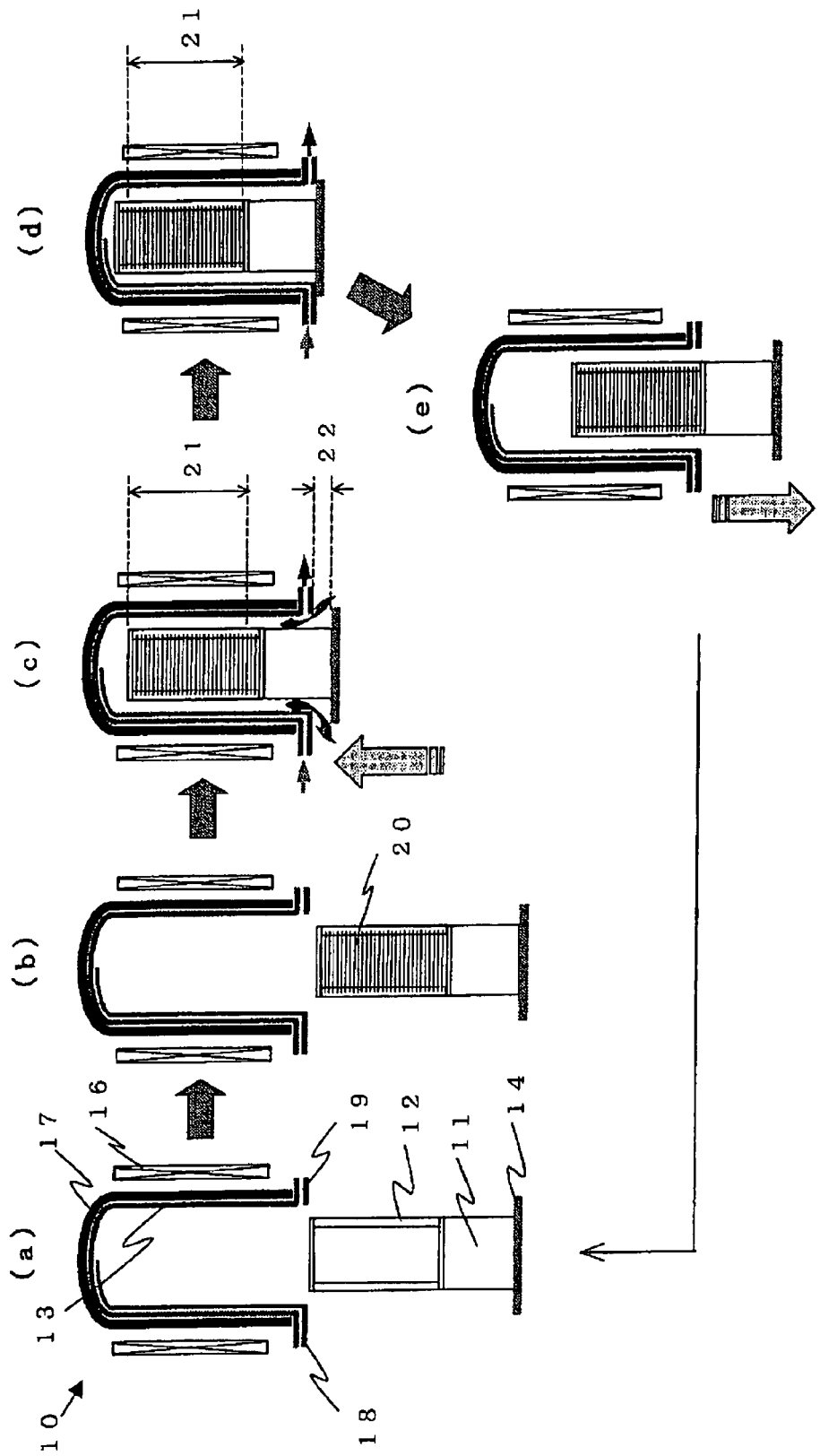
FIG. 1 is a schematic explanatory view showing an example of a method for producing an annealed wafer according to the present invention.

Hereinafter, the present invention will be explained.

The present inventor has taken notice that even when conductive impurities on a surface of the wafer are removed by subjecting the wafer to a preliminary heating at 300-500° C. or the like before a high-temperature heat treatment for producing an annealed wafer, by a subsequent heat treatment, resistivity in the surface of the wafer, particularly in its peripheral part is changed, and has thoroughly investigated the cause. Accordingly, the present inventor has found that the conductive impurities such as phosphorous adhere to wafer jigs such as a boat or a support member, as well as to the surface of the semiconductor wafer, and that the conductive impurities diffuse to the peripheral part of the wafer during the heat treatment and thereby the resistivity is changed.

That is, when the boat is taken out of the furnace tube after finishing the heat treatment, by heat of the boat and the support member and so forth, organic phosphorous and such are suspended from a resin member that is equipment out of the furnace, or from grease in a fan, and are filled in the equipment. Then, the temperature of the boat, the support member, or the like, falls, and the organic phosphorous and such suspended in the equipment adhere to the boat or the support member. Some organic phosphorous and such adhering to the boat, the support member, or the like, are evaporated and discharged out of the furnace when the boat is inserted into the furnace tube. However, in particular, from the reason that the support member has a large contaminated area and its temperature does not rise and an evaporating gas is difficult to get away therefrom, a large proportion of the organic phosphorous and such is not removed and remains adhering, and therewith the support member has been inserted into the furnace. And, the organic phosphorous that do not evaporate in the insertion of the boat diffuse to the peripheral part of the wafer in the heat treatment, and thereby resistivity of the wafer has been changed before and after the heat treatment. Therefore, the wafer placed in the vicinity of a top of the boat in which the organic phosphorous and such are sufficiently removed in the insertion of the boat into the furnace tube has hardly been contaminated with the organic phosphorous and such. However, the wafer placed in the vicinity of a bottom (the side of insertion entrance) of the boat that is near the support member has been drastically contaminated with the organic phosphorous and such.

Accordingly, the present invention has found that in order to certainly remove the conductive impurities such as phosphorous adhering to the surface of the semiconductor wafer, the boat, the support member, and so forth, the boat can be inserted into the furnace tube and before the boat is entirely blocked in with a shutter, a slight interval between the furnace tube and the shutter can be made to remain, so that the conductive impurities adhering to the surface of the wafer, the boat, the support member for the boat are sufficiently evaporated and discharged out of the furnace from the interval between the furnace tube and the shutter. And the present invention has been accomplished.

Hereinafter, embodiments according to the present invention will be explained. However, the present invention is not limited thereto.

FIG. 1 is a schematic explanatory view showing an example of a method for producing an annealed wafer according to the present invention.

FIG. 1(a) is a view showing a state before the semiconductor wafer is placed in the boat.

The heat treatment furnace 10 includes a boat 12 supported by a support member 11, a vertical-type furnace tube 13 for inserting the boat 12 thereinto, a shutter 14 for blocking in the furnace tube 13, a heater 16 for heating the furnace tube 13, a heat uniforming tube 17 for making the heat from the heater 16 is distributed uniformly in the furnace tube 13, a gas inlet tube 18 for introducing a gas into the furnace tube 13, and a gas outlet tube 19 for discharging the gas out of the furnace tube 13.

For example, by using such a heat treatment furnace, in the present invention, an annealed wafer is produced in the manner to be described later.

First, semiconductor wafers 20 are placed in the boat 12 supported by the support member 11 (FIG. 1(b)). In this case, approximately five wafers from the upper side of the boat 12 and approximately ten wafers from the lower side serve as dummy wafers that are not to be products, the semiconductor wafers to be products are placed between the dummy wafers placed in the upper side and in the lower side of the boat 12. Thereby, the semiconductor wafers to be products can be uniformly heat-treated without generating slip therein.

In addition, as the semiconductor wafers to be used in the heat treatment, for example, a silicon wafer having a diameter of 200 mm or more, particularly, 300 mm or more that has been utilized generally for integrated circuits in recent years can be exemplified.

Next, the boat 12 in which the semiconductor wafers 20 are placed is inserted into the furnace tube 13 (FIG. 1(c)).

In the present invention, when the boat 12 in which the semiconductor wafers 20 are placed is inserted into the furnace tube 13, the boat 12 is inserted along with introducing an inert gas such as Ar into the furnace from the gas inlet tube 18, so that the entirety of the semiconductor wafers to be products reaches a thermally uniform portion 21, and then, an insertion rate of the boat 12 in which the semiconductor wafers 20 are placed is decelerated and/or suspended, so that an interval 22 between the furnace tube 13 and the shutter 14 is maintained for a predetermined time.

Here, the thermally uniform portion 21 is a part having a temperature distribution that is uniform in the longitudinal direction by heating with the heater 16.

As described above, in the present invention, the slight interval is made to remain before the furnace tube is entirely blocked in with a shutter, so that the conductive impurities adhering to the surface of the wafer, the boat, the support member for the boat, and so forth, are sufficiently evaporated, and the conductive impurities are discharged out of the furnace from the interval between the furnace tube and the shutter. Thereby, the conductive impurities adhering to the support member and so forth are sufficiently removed, the wafer is in little danger of being contaminated with the conductive impurities during the heat treatment. Therefore, during the heat treatment, the conductive impurities are in little danger of, being transferred from the wafer boat or the support member therefor to the semiconductor wafer, or diffusing from the surface of the semiconductor wafer into the inside thereof. The resistivity of the wafer can be more certainly prevented from changing before and after the heat treatment, and an annealed wafer of desired quality can be obtained.

Moreover, for removing the conductive impurities adhering to the wafer, it is not required to add a preliminary heating step before the heat treatment or to prepare an apparatus for the step in the same manner as a conventional method. Moreover, adjacently installed equipment such as the heating furnace for the preliminary heating is not exposed to a high temperature. Accordingly, compared to a conventional method, the productivity becomes improved and an annealed wafer of high quality can be produced at a lower cost.

In this case, the boat 12 in which the semiconductor wafers 20 are placed is inserted into the furnace tube 13, for example, at a rate of 100 mm/min, and when the interval 22 between the furnace tube 13 and the shutter 14 is 10-100 mm, an insertion rate of the boat 12 in which the semiconductor wafers 20 are placed is decelerated and/or suspended, for example, to be less than 10-100% (10 mm/min~100 mm/min), particularly, to be 25-75% (25 mm/min~75 mm/min). It is preferable that in the state, the interval 22 between the furnace tube 13 and the shutter 14 is maintained. Thereby, the conductive impurities adhering to the support member and so forth can be sufficiently evaporated, and the conductive impurities can be more certainly discharged out of the furnace. In addition, with considering the productivity and discharge effect, it is preferable that the time for maintaining the interval 22 is 30 min or less.

In the present invention, only immediately before the furnace tube is closed, the insertion rate of the boat is reduced or halted, and therefore, the productivity is not so much degraded. Moreover, because the state of an interval between the furnace tube and the shutter is only slight and it is maintained for a predetermined time with flowing an inert gas, impurities inside the furnace tube are easy to be discharged, and such a problem as sucking in the outside air is not caused.

Moreover, in this case, it is preferable that a temperature of the thermally uniform portion 21 when the semiconductor wafers to be products are inserted is 500° C. to 900° C. Thereby, the conductive impurities adhering to the surface of the wafer, the boat, the support member for the boat, and so forth, can be more certainly evaporated. Also, at such a temperature, a problem that a slip dislocation and so forth are generated in the wafer in the insertion of the wafer is not caused.

In addition, as an introduction amount of the inert gas such as Ar into the furnace, 15-30 L/min is preferable.

Next, the furnace tube 13 is blocked in with the shutter 14 and the semiconductor wafers 20 are heat-treated (FIG. 1(d)).

The heat treatment is performed, for example, at a temperature of 800° C. to 1350° C. under an atmosphere containing any one or more of argon gas, nitrogen gas, helium gas, and hydrogen gas. By the heat treatment, the resistivity before and after the heat treatment is hardly changed, and additionally, an annealed wafer of high quality having few Grown-in defects in the vicinity of a surface layer thereof can be obtained.

In this case, it is preferable that the semiconductor wafer to be heat-treated contains nitrogen with a concentration of $1 \times 10^{13}$~$1 \times 10^{15}$ atoms/cm$^3$. In such a semiconductor wafer, sizes of the Grown-in defects are scaled-down, the Grown-in defects in the vicinity of the surface layer are easy to be made to disappear by the heat treatment. Accordingly, by the heat treatment, an annealed wafer of high quality having no Grown-in defects in the vicinity of a surface layer thereof can be more certainly obtained.

Then, after the heat treatment, the boat 12 is taken out of the furnace tube 13 (FIG. 1(e)).

In an annealed wafer produced by such a method according to the present invention, a concentration of phosphorous in a portion from surface to a depth of 3 μm is $5 \times 10^{14}$ atoms/cm$^3$ or less, particularly $2 \times 10^{14}$ atoms/cm$^3$ or less, furthermore, $1 \times 10^{14}$ atoms/cm$^3$ or less, and there are extremely little contamination with phosphorous after the heat treatment. Therefore, the resistivity of the wafer hardly changes before and after the heat treatment, and the annealed wafers are of extremely high quality.

In addition, after the boat 12 is taken out of the furnace tube 13, the annealed wafer is collected from the boat 12 (FIG. 1(a)). By placing next semiconductor wafers in the boat 12 again (FIG. 1(b)), the heat treatment can be repeated.

Hereinafter, the present invention will be specifically explained with reference to Examples and Comparative example. However, the present invention is not limited thereto.

Example 1

Silicon wafers having a diameter of 200 mm were heat-treated according to the procedure as shown in FIG. 1. The silicon wafer used in the heat treatment was a P type (doped with boron) and had a resistivity of 8-12 Ωcm, a plane orientation of (100), and a nitrogen concentration of $8 \times 10^{13}$ atoms/cm$^3$.

First, fifty silicon wafers 20 were placed in the boat 12 supported by the support member 11 (FIG. 1(a)(b)). In this case, five wafers from the upper side of the boat 12 and ten wafers from the lower side were set to serve as dummy wafers that were not to be products, and the semiconductor wafers to be products were placed between the dummy wafers placed in the upper side and in the lower side of the boat 12. The length of the part for placing wafers in the boat 12 was 945 mm.

Next, the boat 12 in which the silicon wafers 20 were placed was inserted in the furnace tube 13 (FIG. 1(c)). That is, into the furnace in which the temperature of the thermally uniform portion 21 was set to 700° C., the boat 12 was inserted at a rate of 100 mm/min with introducing an Ar gas at 20 L/min from the gas inlet tube 18. Then, when the interval 22 between the furnace tube 13 and the shutter 14 became 50 mm, suspension was performed for 1 min. Then, the boat 12 was inserted at an insertion rate of 50 mm/min, and the furnace tube 13 was blocked in with the shutter 14. In addition, when the interval between the furnace tube 13 and the shutter 14 became 100 mm, the entirety of the semiconductor wafers reached the thermally uniform portion 21 having a length of approximately 900 mm. Moreover, the boat and the support member were almost in the state of being inserted into the furnace. And, by the suspension and the subsequent decelerated insertion rate of the insertion of the boat 12, the entirety of the silicon wafers to be products was in the thermally uniform portion 21, and the state that the interval 22 between the furnace tube 13 and the shutter 14 was existing was maintained for 2 min.

Next, the silicon wafers 20 were heat-treated (FIG. 1(d)). The temperature of the heat treatment was 1200° C. and the heat treatment was performed under an atmosphere containing an argon gas.

Then, after the heat treatment, the boat 12 was taken out from the furnace tube 13 (FIG. 1(e)).

Figure 2:
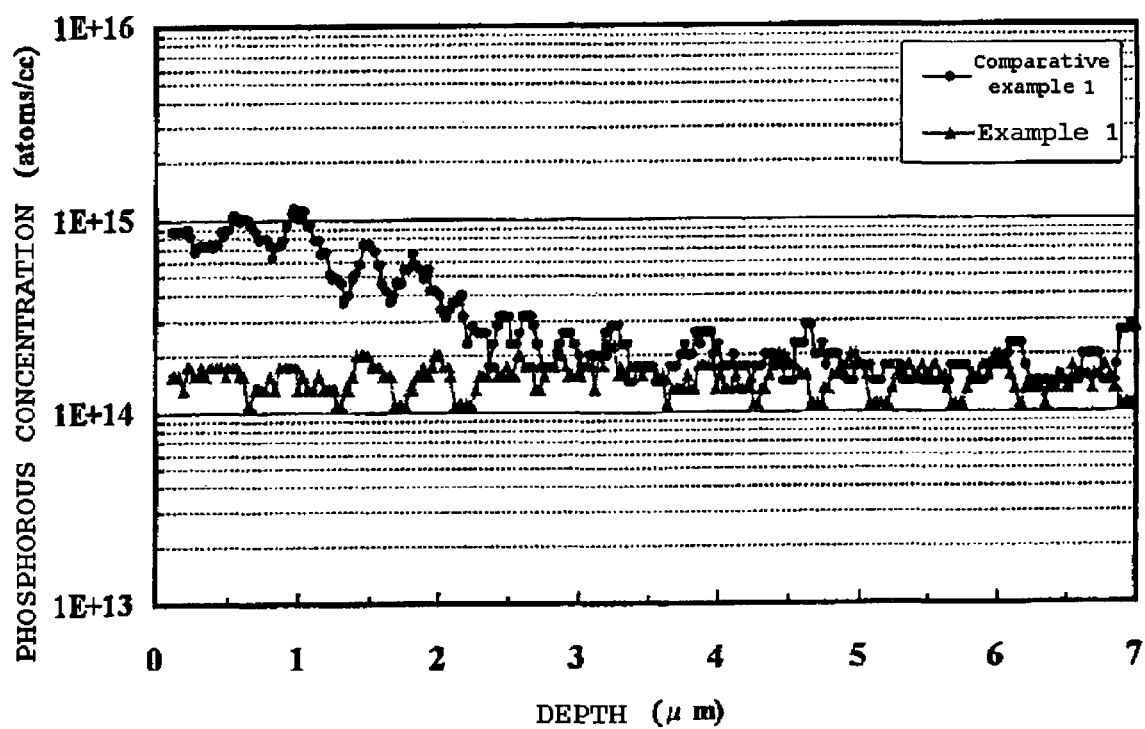
FIG. 2 is a profile of a phosphorous concentration in a depth direction from a surface of each of the annealed wafers after the heat treatment (Example 1 and Comparative example 1).

As a result of measuring resistivity of the annealed wafer after the heat treatment, it was found that in both the wafer placed in the top of the boat that was in the uppermost side for the wafers to be products and the wafer placed in the bottom of the boat that was in the undermost side for the wafers to be products, the resistivity was 8-12 Ωcm, which hardly changed before and after the heat treatment, and there was extremely little contamination with phosphorous during the heat treatment. A profile of the phosphorous concentration measured by SIMS was shown in FIG. 2. As shown in FIG. 2, in Example 1, it is found that from surface to a depth of 3 μm, an almost flat profile is indicated, which is the minimum limit of detection of SIMS of $2 \times 10^{14}$ atoms/cm$^3$ or less. As described above, it is found that by the method according to the present invention, annealed wafers of extremely high quality can be obtained.

In addition, in FIG. 2, for example, 1E+14 represents $1\times10^{14}$.

Example 2

Annealed wafers were produced in the same method as Example 1 except that when the boat 12 in which the silicon wafers 20 were placed was inserted into the furnace tube 13 (FIG. 1(c)), after the interval 22 between the furnace tube 13 and the shutter 14 became 25 mm by inserting the boat 12 at a constant rate of 100 mm/min, the boat 12 was inserted at an insertion rate of 25 mm/min and the furnace tube 13 was blocked in with the shutter 14. In addition, the state that the entirety of the silicon wafers to be products was in the thermally uniform portion 21 and that the interval 22 between the furnace tube 13 and the shutter 14 existed was maintained for 1 min.

Similarly to Example 1, in the both wafers in the bottom and the top, resistivity was 8-12 Ωcm. Thereby, it was found that the resistivity hardly changed before and after the heat treatment, and that there was extremely little contamination with phosphorous during the heat treatment (both resistivity and SIMS profile were the same results as Example 1). As described above, it is found that according to the method of the present invention, annealed wafers of extremely high quality can be obtained.

Comparative Example 1

Annealed wafers were produced in the same method as Example 1 except that when the boat 12 in which the silicon wafers 20 were placed was inserted into the furnace tube 13 (FIG. 1(c)), the boat 12 was inserted at a constant rate of 100 mm/min, the suspension and the deceleration were not performed.

As a result of measuring resistivity of the annealed wafer after the heat treatment, in the wafer placed in the top of the boat, resistivity after the heat treatment was 8-12 Ωcm, which hardly changed before and after the heat treatment. However, in the wafer placed in the bottom, resistivity in the peripheral part of the wafer was 25 Ωcm or more. That is, it is found that in the bottom, the peripheral part of the wafer was drastically contaminated with phosphorous during the heat treatment. In addition, when a phosphorous concentration in the wafer was measured by SIMS, the concentration from surface to a depth of 3 μm was $11\times10^{14}$ atoms/cm$^3$ to $2\times10^{14}$ atoms/cm$^3$.

The present invention is not limited to the above-described embodiments. The above-described embodiments are mere examples, and those having the substantially same constitution as that described in the appended claims and providing the similar action and advantages are included in the scope of the present invention.

The invention claimed is:

1. A method for producing an annealed wafer, the method comprising at least:
    placing one or more semiconductor wafers in a boat supported by a support member;
    inserting the boat, in which the one or more semiconductor wafers are placed, at an insertion rate into a furnace tube;
    disposing one or more semiconductor wafers to be products of the one or more semiconductor wafers in a thermally uniform portion of the furnace tube, the thermally uniform portion having a temperature distribution that is uniform in a longitudinal direction by heating with a heater;
    blocking in the furnace tube with a shutter; and
    heat-treating the one or more semiconductor wafers;
    wherein when the boat, in which the one or more semiconductor wafers are placed, is inserted into the furnace tube, introducing an inert gas into the furnace tube along with the boat, so that an entirety of the one or more semiconductor wafers to be products reach the thermally uniform portion; then
    the insertion rate of the boat, in which the one or more semiconductor wafers are placed, is decelerated and/or suspended, so that an interval between the furnace tube and the shutter is maintained for a predetermined time; and then
    the furnace tube is blocked in with the shutter.

2. The method for producing an annealed wafer according to claim 1, wherein the furnace tube is a vertical type.

3. The method for producing an annealed wafer according to claim 1, wherein a temperature of the thermally uniform portion when the one or more semiconductor wafers to be products are inserted is 500° C. to 900° C.

4. The method for producing an annealed wafer according to claim 1, wherein the heat treatment of the one or more semiconductor wafers are performed at a temperature of 800° C. to 1350° C. under an atmosphere containing any one or more of argon gas, nitrogen gas, helium gas, and hydrogen gas.

5. The method for producing an annealed wafer according to claim 1, wherein the one or more semiconductor wafers to be heat-treated are silicon wafers having a diameter of 200 mm or more.

6. The method for producing an annealed wafer according to claim 1, wherein the one or more semiconductor wafers to be heat-treated contain nitrogen with a concentration of $1\times10^{13}$ to $1\times10^{15}$ atoms/cm$^3$.

7. The method for producing an annealed wafer according to claim 2, wherein a temperature of the thermally uniform portion when the one or more semiconductor wafers to be products are inserted is 500° C. to 900° C.

8. The method for producing an annealed wafer according to claim 2, wherein the heat treatment of the one or more semiconductor wafers are performed at a temperature of 800° C. to 1350° C. under an atmosphere containing any one or more of argon gas, nitrogen gas, helium gas, and hydrogen gas.

9. The method for producing an annealed wafer according to claim 3, wherein the heat treatment of the one or more semiconductor wafers are performed at a temperature of 800° C. to 1350° C. under an atmosphere containing any one or more of argon gas, nitrogen gas, helium gas, and hydrogen gas.

10. The method for producing an annealed wafer according to claim 7, wherein the heat treatment of the one or more semiconductor wafers are performed at a temperature of 800° C. to 1350° C. under an atmosphere containing any one or more of argon gas, nitrogen gas, helium gas, and hydrogen gas.

11. The method for producing an annealed wafer according to claim 10, wherein the one or more semiconductor wafers to be heat-treated are silicon wafers having a diameter of 200 mm or more.

12. The method for producing an annealed wafer according to claim 11, wherein the one or more semiconductor wafers to be heat-treated contain nitrogen with a concentration of $1\times10^{13}$ to $1\times10^{15}$ atoms/cm$^3$.

* * * * *